United States Patent
Lips et al.

(10) Patent No.: US 11,137,459 B2
(45) Date of Patent: Oct. 5, 2021

(54) RADIO FREQUENCY (RF) ANTENNA ELEMENT WITH A DETUNING SYSTEM

(71) Applicant: KONINKLIJKE PHILIPS N.V., Eindhoven (NL)

(72) Inventors: Oliver Lips, Hamburg (DE); Martinus Bernardus Van Der Mark, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/042,403

(22) PCT Filed: Mar. 26, 2019

(86) PCT No.: PCT/EP2019/057483
§ 371 (c)(1),
(2) Date: Sep. 28, 2020

(87) PCT Pub. No.: WO2019/185568
PCT Pub. Date: Oct. 3, 2019

(65) Prior Publication Data
US 2021/0141038 A1    May 13, 2021

(30) Foreign Application Priority Data
Mar. 29, 2018    (EP) ..................... 18164905

(51) Int. Cl.
*G01R 33/36*    (2006.01)
(52) U.S. Cl.
CPC ..... *G01R 33/3692* (2013.01); *G01R 33/3657* (2013.01)

(58) Field of Classification Search
CPC ................. G01R 33/3692; G01R 33/3657
See application file for complete search history.

(56) References Cited

U.S. PATENT DOCUMENTS

| | | | |
|---|---|---|---|
| 5,545,999 A * | 8/1996 | Mueller | G01R 33/3621 324/318 |
| 5,666,055 A | 9/1997 | Jones et al. | |
| 5,869,966 A | 2/1999 | Gatehouse | |

(Continued)

FOREIGN PATENT DOCUMENTS

| CN | 203433101 U2 | 2/2014 |
|---|---|---|
| DE | 102007056233 A1 | 5/2009 |

(Continued)

OTHER PUBLICATIONS

Kom et al "Optically Detunable Inductively Coupled Coil for Self-Gating in Small Animal Magnetic Resonance Imaging" MRM 65 (2011)p. 882-888.

(Continued)

*Primary Examiner* — Gregory H Curran

(57) ABSTRACT

An RF antenna element with a detuning system in which the RF antenna element comprises a resonant electrically conductive loop. The (de)tuning system comprising a switching element to (de)tune the resonant electrically conductive loop. The (de)tuning system element includes an electroluminescent element coupled to the resonant electrically conductive loop. The (de)tuning system includes a photoelectrical conversion element to detect an electroluminescent signal from the electroluminescent element.

10 Claims, 3 Drawing Sheets

(56) References Cited

U.S. PATENT DOCUMENTS

| | | | |
|---|---|---|---|
| 6,144,205 | A | 11/2000 | Souza et al. |
| 2004/0124838 | A1 | 7/2004 | Duerk et al. |
| 2006/0250135 | A1 | 11/2006 | Buchwald et al. |
| 2007/0164746 | A1 | 7/2007 | Jevtic et al. |
| 2008/0157762 | A1 | 7/2008 | Weiss |
| 2012/0176135 | A1 | 7/2012 | Iannotti et al. |
| 2013/0127461 | A1 | 5/2013 | Popescu |
| 2014/0292327 | A1 | 10/2014 | Griwold et al. |
| 2015/0234021 | A1* | 8/2015 | Yu .................... G01R 33/3875 324/322 |

FOREIGN PATENT DOCUMENTS

| | | |
|---|---|---|
| JP | 01223943 A | 9/1989 |
| JP | 03103232 A | 4/1991 |
| JP | 2807281 B2 | 10/1998 |
| WO | 2011159018 A2 | 12/2011 |
| WO | 2014072891 A1 | 5/2014 |

OTHER PUBLICATIONS

International Search Report and Written Opinion from PCT/EP2019/057483 dated Jun. 28, 2019.

R. Ayde et al "Active Optical Based Decoupling Circuit for Receiver Endoluminal Coil" Proceedings of the International Soc. for Magnetic Resonance in Med. No. 1343 Apr. 28, 2014.

E. W. Jacobs, D. W. Fogliatti, H. Nguyen, D. J. Albares, C. T. Chang and C. K. Sun, "Photo-injection p-i-n diode switch for high-power RF switching," in IEEE Transactions on Microwave Theory and Techniques, vol. 50, No. 2, pp. 413-419, Feb. 2002.

Van der Mark et al "All Opitcal Power and Data Transfer in Catheters using an Efficient LED" Proc. SPIE 9317, Optical Fibers and Sensors for Medical Diagnostics and Treatment Applications (Mar. 11, 2015); doi:10.1117/12.2076044.

E. Y. Wong et al.,"An Optical System for Wireless Detuning of Parallel Resonant Circuits" Journal of Magnetic Resonance Imaging 12 p. 632-638 (2000).

Natalia Gudino et al., "On-Coil Multiple Channel Transmit System Based on Class-D Amplification and Pre-Amplification with Current Amplitude Feedback" Magnetic Resonance in Med. vol. 70 p. 276-289 (2013).

* cited by examiner

RADIO FREQUENCY (RF) ANTENNA ELEMENT WITH A DETUNING SYSTEM

CROSS REFERENCE TO RELATED APPLICATIONS

This application is a U.S. national phase application of International Application No. PCT/EP2019/057483 filed on Mar. 26, 2019, which claims the benefit of EP Application Serial No. 18164905.4 filed on Mar. 29, 2018 and is incorporated herein by reference.

FIELD OF THE INVENTION

The invention pertains to radio frequency (RF) antenna element with a detuning system and a resonant electrically conductive loop.

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field B0 whose direction at the same time defines an axis (normally the z-axis) of the co-ordinate system to which the measurement is related. The magnetic field B0 causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field B1 of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant T1 (spin lattice or longitudinal relaxation time), and the magnetization in the direction perpendicular to the z-direction relaxes with a second and shorter time constant T2 (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, magnetic field gradients extending along the three main axes are superposed on the uniform magnetic field B0, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

BACKGROUND OF THE INVENTION

The paper 'Optically detunable, inductively coupled coil for self-gating in small animal magnetic resonance imaging', by M. Korn et al. in MRM65(2011)882-888, discloses a radio frequency (RF) antenna element with a detuning system arranged for optically detuning the RF antenna element. The known RF antenna element is formed by a single loop coil of a small resonant surface coil that can be dynamically detuned by a capacitor shunted with two pin-diodes connected to a photodiode. Under illumination, the photocurrent of the photodiodes switches the pin-diodes into the conducting state, detuning the surface coil.

SUMMARY OF THE INVENTION

An object of the invention is to provide an RF antenna element with a detuning system that can be controlled more accurately.

This object is achieved by an RF antenna element with a detuning system in which the RF antenna element comprising a resonant electrically conductive loop and the (de)tuning system comprising a switching element to (de)tune the resonant electrically conductive loop, wherein the (de)tuning system element includes an electroluminescent element coupled to the resonant electrically conductive loop and the (de)tuning system includes a photo-electrical conversion element to detect an electro-luminescent signal from the electroluminescent element.

According to the invention an electroluminescent element is provided in the detuning system. The electroluminescent element coupled to the resonant electrically conductive loop generates an electroluminescence optical signal in response to a voltage applied to it by its detuning system. The electrically conductive loop forms the RF antenna. The electrically conductive loop may be a round loop, but may also be formed by another electrical conductor geometry that has sensitivity to pick-up magnetic flux. This electroluminescent optical signal is detected by a photo-electrical converter which in response produces an electronic feedback signal that is representative for the (de)tuning state of the resonant electrically conductive loop. Thus, the electronic feedback signal makes available information on the (de) tuning state of the resonant electrically conductive loop. On the basis of that information the detuning system can be more accurately controlled. Quite effective electroluminescence is found in GaInN-semiconductors which operate efficiently in a wavelength-band around 405 nm. For GaInN-based devices photovoltaic power generation efficient is about 42%, electroluminescence efficiency is about 43% and photo-induced electroluminescence has about 18% efficiency. Alternatively Si-based semiconductor materials may be used, although these may have a lower efficiency.

The use of an electro-optical converter in a radio frequency (RF) antenna element with a resonant electrically conductive loop is known per se from the German patent application DE 10 2007 056 233. This known RF antenna element includes a local coil antenna that is coupled to a signal amplifier to amplify the magnetic resonance signal picked up by the local coil antenna. The amplified magnetic resonance signal is digitised and then applied to an electro-optical converter which derives an optical signal from the digital magnetic resonance signal. The optical signal is transmitted over an optical signal path to an optical receiver. The optical receiver turns the received optical signal into a digital receiver signal that is applied to a signal processor for reconstruction of the magnetic resonance image. This known RF antenna element does not feature an electro-optical converter in conjunction with a detuning system.

These and other aspects of the invention will be further elaborated with reference to the embodiments defined in the dependent Claims.

In a preferred embodiment of the RF antenna element with a detuning system of the invention, the electroluminescent element is formed by a photo detector circuited in series with the switch element. A control optical source is provided coupled to the photodetector. When optical radiation, e.g. light, (such as blue light with a wavelength around 405 nm), is incident on the photodetector, the photodetector generates a control voltage to the switching element to open or close the switching element so that the electrically conductive loop is switched between resonant and non-resonant. Depending on the voltage over the photodetector in the form of an electroluminescent element, an (optical) electroluminescent signal is generated by the photodetector (by way of electroluminescence and photo induced electroluminescence). This electroluminescent signal is converted into the electronic feedback signal that is representative for the (de)tuning state of the resonant electrically conductive loop.

In another preferred embodiment of the RF antenna element with a detuning system of the invention, the switching element forms the electroluminescent element. An injection optical source is coupled to the switching element and when optical radiation, e.g. (blue) light, is incident on the switching element, the switching element becomes electrically conducting and is switched to its closed state. Thus, the switching element can be switched between its closed and open states by switching on or off of the injection optical source. Accordingly the electrically conductive loop is switched between its resonant and non-resonant state. The voltage, i.e. the induced radio frequency voltage, across the switching element causes, due its electroluminescent properties, to generate the electroluminescent signal. This electroluminescent signal is converted into the electronic feedback signal that is representative for the (de)tuning state of the resonant electrically conductive loop.

The electronic feedback signal represents the switching element's (open or closed) state and accordingly provides information on whether the electrically conductive loop is in its resonant or its non-resonant state.

As the voltage over the electroluminescent element depends on the load of the electrically conductive loop, the electronic feedback signal depends on the load. Thus the electronic feedback signal may be employed to monitor the actual load onto the electrically conductive loop. There may be about an order of magnitude difference between the signal level of the electronic feedback signal for an open circuit condition and for a closed circuit condition.

In further embodiments of the RF antenna element with a detuning system according to the invention, parts of the optical paths overlap between the electroluminescent element and the control optical source or the injection optical source and between the photo-electrical conversion element and the electroluminescent element. In this way the number of optical connections is reduced. Also the optical efficiency is improved because only a single fibre may capture the emitted photons. This is achieved using an optical separator, such as a dichroic mirror. The dichroic mirror reflects the light from the electroluminescent element to the photo-electrical conversion element and transmits light from the injection optical source and from the control optical source. The dichroic mirror or dichroic beam splitter achieves near-complete separation of the transmitted and reflected optical signals. This further avoids crosstalk between optical signals. Alternatively, a conventional 50/50-beamsplitter or a polarising beam splitter may be employed, which, however comes with a loss of optical signal in both transmission and reflection. Further alternatives for the optical separator may be to employ a diffraction grating or a Fresnel-like 450-beamsplitter.

These and other aspects of the invention will be elucidated with reference to the embodiments described hereinafter and with reference to the accompanying drawing wherein

DETAILED DESCRIPTION OF THE EMBODIMENTS

Figure 1:
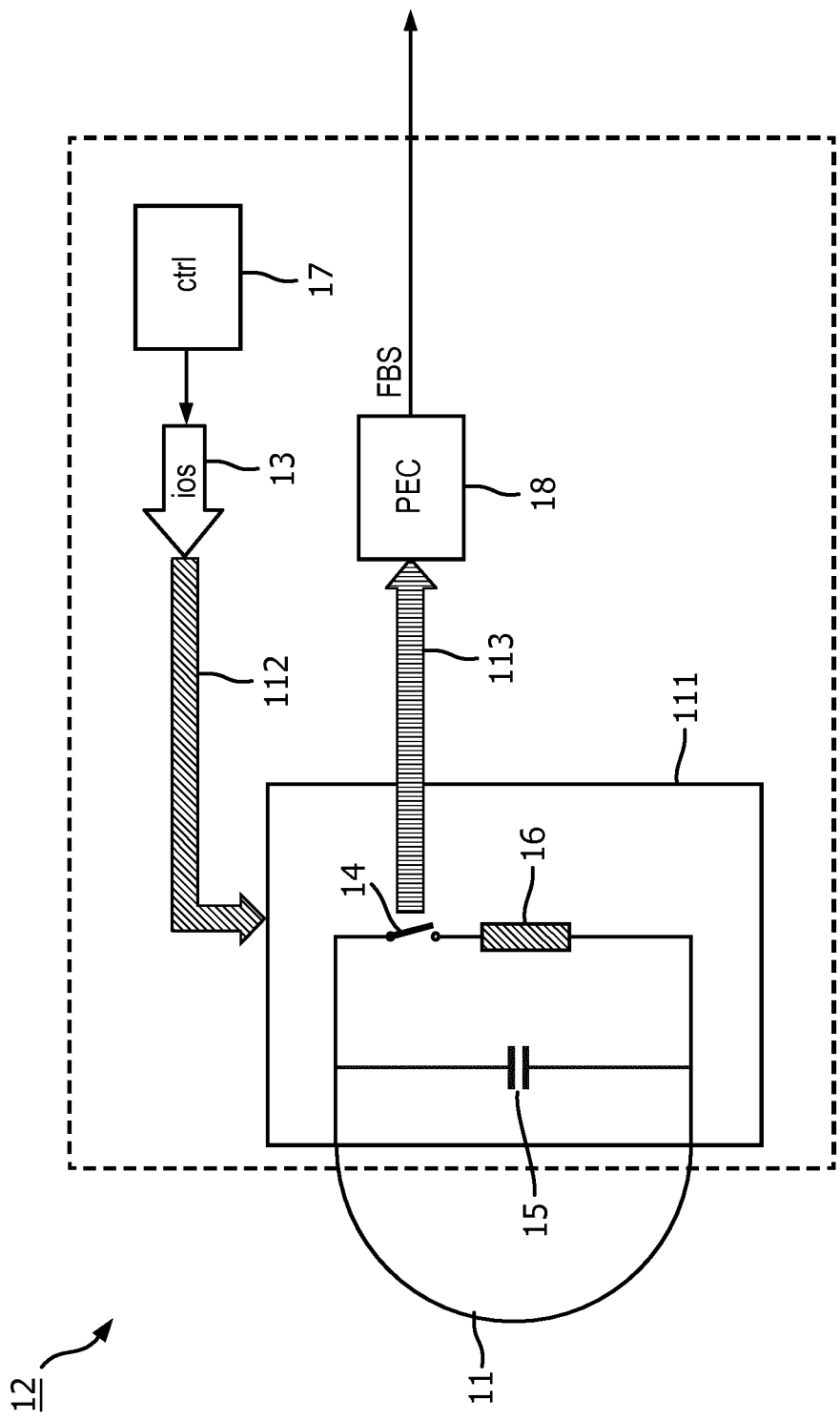
FIG. 1 shows a diagrammatic representation of an embodiment of the radio frequency (RF) antenna element with detuning system of the invention wherein the electroluminescent element is formed by the switching element in the detuning circuit.

FIG. 1 shows a diagrammatic representation of an embodiment of the radio frequency (RF) antenna element with detuning system of the invention wherein the electroluminescent element is formed by the switching element in the detuning circuit 111.

The antenna element 11 is formed by the electrically conductive coil loop 11 in which a tuning capacitor 15 is circuited in series to render the electrically conductive loop resonant in the Larmor frequency band and sensitive to pick-up magnetic flux due to magnetic resonance. The detuning circuit is electrically coupled to the electrically conductive coil loop 11 and includes the switching element 14 with an induction 16 in series with the switching element 14. In order to close the switching element 14 optical radiation (e.g. light) from the injection optical source 13 is incident on the electroluminescent switching element 14, e.g. a pin-diode via an optical link 112. The switching operation is controlled by the control unit 17 that controls the injection optical source 13 to be switched on and off, or to control an interruption of the optical link 112. When the electroluminescent switching element is made conductive (i.e. the switch is closed) an inductance 16 is in series with the tuning capacitance 15, so that the resonance frequency of the electrically conductive loop 11 is shifted. Thus, by switching the injection optical source 13 on or off the electrically conductive loop's state is switched between resonant and non-resonant. Because the switching element is electroluminescent, it generates luminescent radiation (luminescence light) 113 which is detected by the photo-electrical conversion element 18 and converted into the electronic feedback signal. The feedback signal carries information on the state of the switching element. Variations in the feedback signal may relate to variations in the bias current due to temperature changes and may give insight into the thermal load. Additionally, the induced voltages of the RF transmit pulses will lead to voltage/current variations at the diodes/switching elements. Depending on the actual implementation the variations will occur in different frequency ranges. There can e.g. appear a partial rectification of the RF signals by the PIN diode, which leads to currents in the low frequency (<10 kHz) range. The corresponding load variation of the photovoltaic power supply will thus cause a PEL signal. The forward resistance of PIN diodes also tends to vary with applied RF power, thus creating signals at higher harmonics of the applied frequency. These signals are as well indicative of the induced RF voltages. Altogether it might be advantages to measure PEL signals at the MR (Larmor) frequency or at multiples of the MR frequency in order to get insights into the induced RF signals. The induced RF signals themselves allow valuable conclusions about the actual RF transmit field strength at the location of the coil and/or the proper function of the RF coil (a too low signal might be caused by a problem in the transmit chain or by a broken receive coil). Since there are typically several coil channels a rough local characterization of the transmit field may be obtained.

Figure 2:
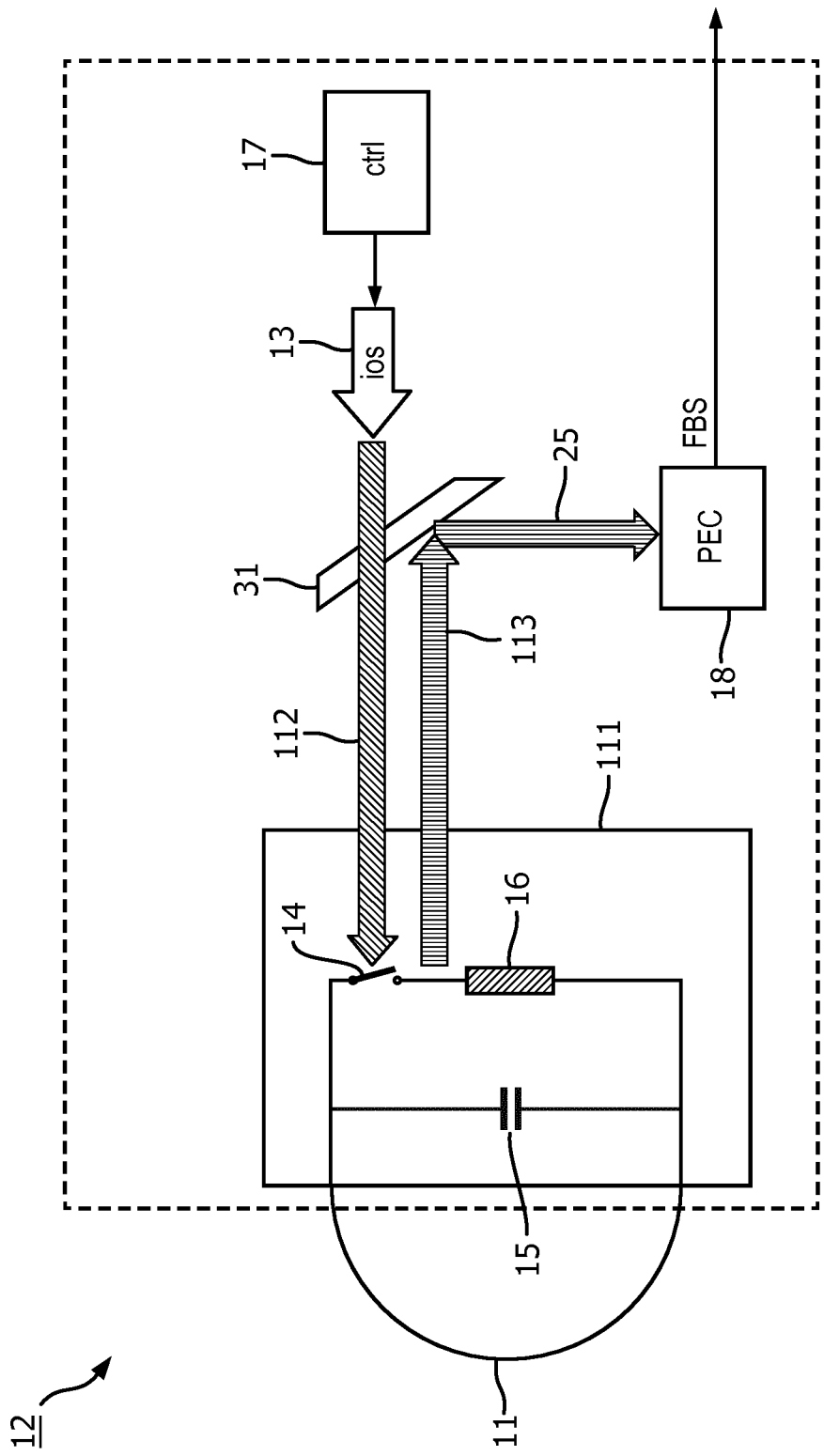
FIG. 2 shows a diagrammatic representation of another embodiment of the radio frequency antenna element with detuning system wherein the electroluminescent element is formed by the switching element in the detuning circuit.

FIG. 2 shows a diagrammatic representation of another embodiment of the radio frequency antenna element with detuning system wherein the electroluminescent element is formed by the switching element 14 in the detuning circuit 111. This embodiment is similar to that of FIG. 1. In the embodiment of FIG. 2, the optical paths 112, 113 of the injection optical radiation and the electroluminescence from the electroluminescent element partially overlap. The injection optical light to the switching element and the electroluminescent light from the switching element are separated by an optical separator, e.g. a dichroic mirror 31. Typically, for a single blue LED photodetector about 2.6V is sufficient to generate the electroluminescence. By employing several of these devices in series the total voltage may be increased. The generated luminescent radiation (luminescent light) 113 is detected by the photo-electrical conversion element 18 and converted into the electronic feedback signal.

Figure 3:
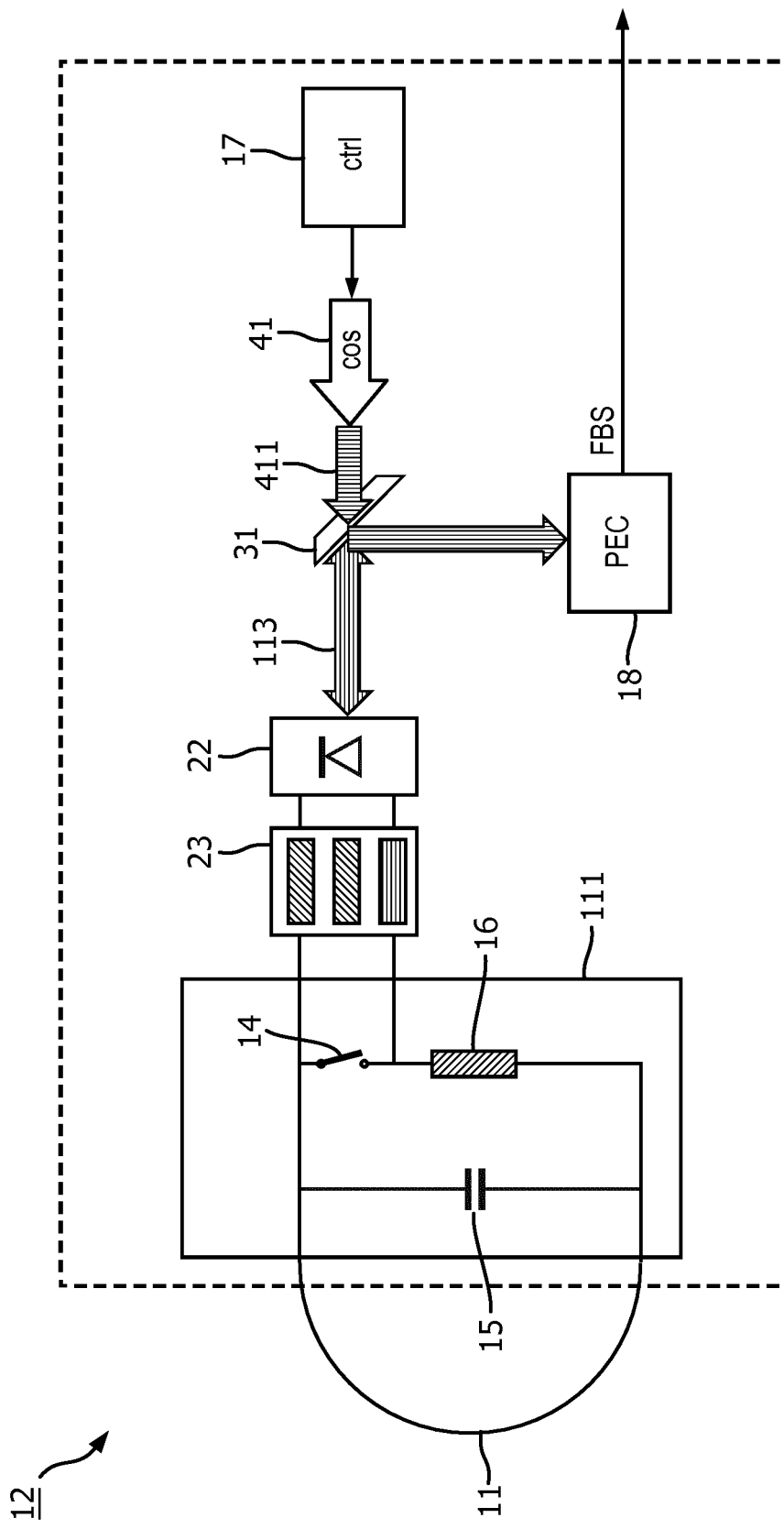
FIG. 3 shows a diagrammatic representation of an embodiment of the radio frequency (RF) antenna element with detuning system of the invention wherein the electroluminescent element is formed by the photodetector in series with the switching element in the detuning circuit and wherein a control optical source is included to control the photodetector to apply a control voltage to the switching element.

FIG. 3 shows a diagrammatic representation of an embodiment of the radio frequency (RF) antenna element with detuning system of the invention wherein the electroluminescent element is formed by the photodetector 22 in series with the switching element 14 in the detuning circuit and wherein a control optical source 41 is included to control the photodetector to apply a control voltage to the switching element. In the embodiment of FIG. 3, the switching element 14 is controlled by a control voltage form the photodetector 22. The photo-detector 22 forms the electroluminescent element. Hence, the photodetector 22 generates electroluminescence in dependence of the voltage applied to it due to the RF antenna element 11. The control optical source 41 may emit a control optical radiation beam onto the photodetector 22 which then generates the control voltage applied to the switching element. The control light source may be a blue ray laser (wavelength in the 405 nm band) or a blue light emitting LED. The photoconductor may be a GaN based semiconductor device, like a blue GaInN LED. By applying the control voltage to the switching element 14, the switching element may be opened or closed depending on the polarity of the control voltage. Thus, by switching on or off the control optical source 41, the electrically conductive loop 11 is changed between its resonant or off-resonant state in that its resonance frequency may be shifted into or out of the Larmor frequency band. For example at a bias electrical current of about 5 mA the blocking resistance is generally larger than 1 kΩ. This may be achieved by a diode that can provide about 10 mA for approximately 50 mW optical power. The photodetector 22 forms the electroluminescent element so that depending on the voltage applied over the photo-detector by the electrically conductive loop, the photodetector 22 emits luminescence that is detected by the photo-electrical conversion element 18 and converted into the electronic feedback signal. The optical paths of the electroluminescent light 113 from the photodetector 22 to the photo-electrical conversion element 18 and of the control radiation beam 411 from the control optical source 41 to the photodetector 22 partially overlap. The optical separator 31 deflects the electroluminescent light from the photodetector 22 to the photo-electrical conversion element 18 and transmits the control radiation beam 411 from the control optical source 41 to the photodetector 22. Good results are achieved with a dichroic mirror which may have a transition-width of wavelengths between transmission and reflection of about 10 nm. The dichroic mirror may be reflective for wavelengths less than 420 nm (e.g. 405 nm) and transmission for wavelengths above 420 nm (e.g. 440 nm).

The invention claimed is:

1. A radio frequency (RF) antenna element with a (de)tuning system for magnetic resonance imaging (MRI),
the RF antenna element comprising:
a resonant electrically conductive loop and
the (de)tuning system comprising an electroluminescent switching element to (de)tune the resonant electrically conductive loop, wherein
the electroluminescent switching element is coupled to the resonant electrically conductive loop, wherein
the (de)tuning system includes a photo-electrical conversion element to detect an electro-luminescent signal from the electroluminescent switching element.

2. The RF antennal element of claim 1, wherein
the electroluminescent switching element comprises a photodetector circuited in series with a switching element and
the (de)tuning system includes a control optical source optically coupled to the photodetector by a control optical radiation beam, wherein the control optical source is configured to switch a state of the electrically conductive loop between resonant and off-resonant; and
the photodetector is optically coupled to the photo-electrical conversion element to convert an electroluminescent signal from the photodetector into an electronic feedback signal (FBS).

3. The RF antenna element of claim 1, wherein
the (de)tuning system includes an injection optical source optically coupled to the electroluminescent switching element, wherein the injection optical source is configured to switch a state of the electrically conductive loop between resonant and non-resonant; and
the electroluminescent switching element is optically coupled to the photo-electrical conversion element to convert an electroluminescent signal from the electroluminescent element into an electronic feedback signal (FBS).

4. The RF antenna element as claimed in claim 2, wherein the electronic feedback signal represents the electroluminescent switching element's state.

5. The RF antenna element of claim 2, wherein the electronic feedback signal represents the electrically conductive loop's actual load.

6. The RF antenna element of claim 2, wherein the electronic feedback signal represents induced RF voltages in the electrically conductive loop.

7. The RF antenna element of claim 2, wherein an optical separator is configured in the optical paths between the electroluminescent element and the control optical source and the optical path between the photodetector and the photo-electrical conversion element.

8. The RF antenna element of claim 3, wherein an optical separator is configured in the optical paths between the electroluminescent switching element and the injection optical source and the optical path between the electroluminescent switching element and the photo-electrical conversion element.

9. The RF antenna element of claim 7, wherein the optical separator is a dichroic mirror.

10. The RF antenna element of claim 8, wherein the optical separator is a dichroic mirror.

* * * * *